US011209215B2

(12) United States Patent
Chiriac et al.

(10) Patent No.: US 11,209,215 B2
(45) Date of Patent: Dec. 28, 2021

(54) ENHANCED COOLING OF AN ELECTRONIC DEVICE USING MICROPUMPS IN THERMOSIPHONS

(71) Applicant: QUALCOMM Incorporated, San Diego, CA (US)

(72) Inventors: Victor Adrian Chiriac, Phoenix, AZ (US); Jorge Luis Rosales, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 123 days.

(21) Appl. No.: 16/047,275

(22) Filed: Jul. 27, 2018

(65) Prior Publication Data

US 2020/0033066 A1 Jan. 30, 2020

(51) Int. Cl.
*F28D 15/02* (2006.01)
*F28D 15/06* (2006.01)

(52) U.S. Cl.
CPC ....... *F28D 15/025* (2013.01); *F28D 15/0266* (2013.01); *F28D 15/06* (2013.01)

(58) Field of Classification Search
CPC .... F28D 15/02; F28D 15/025; F28D 15/0266; F28D 15/06; F24S 10/00; F24S 20/00
USPC .......................................... 165/274; 126/646
See application file for complete search history.

(56) References Cited

U.S. PATENT DOCUMENTS

| 7,188,484 | B2* | 3/2007 | Kim | .................. G06F 1/203 165/104.33 |
| 9,146,059 | B2* | 9/2015 | Hoang | .................. F28D 15/043 |
| 9,999,157 | B2 | 6/2018 | Chiriac et al. | |
| 2003/0051859 | A1* | 3/2003 | Chesser | ................ F28D 15/043 165/46 |
| 2004/0104012 | A1* | 6/2004 | Zhou | .................. H01L 23/4275 165/104.26 |
| 2004/0190253 | A1* | 9/2004 | Prasher | ............... F28D 15/0233 361/699 |
| 2005/0217829 | A1* | 10/2005 | Belits | ........................ F28F 3/02 165/104.33 |
| 2007/0068654 | A1* | 3/2007 | Chang | ..................... F28D 15/04 165/104.21 |
| 2007/0151275 | A1* | 7/2007 | Chiriac | ................... F25B 39/00 62/259.2 |
| 2007/0284093 | A1* | 12/2007 | Bhatti | ..................... G06F 1/206 165/104.33 |

(Continued)

*Primary Examiner* — Len Tran
*Assistant Examiner* — Gustavo A Hincapie Serna
(74) *Attorney, Agent, or Firm* — Patterson & Sheridan, L.L.P.

(57) ABSTRACT

Certain aspects of the present disclosure generally relate to techniques for cooling electronic devices using thermosiphons having one or more micro-pumps at least partially disposed therein. A provided thermosiphon generally includes a fluid; a first evaporator configured to evaporate the fluid, wherein the first evaporator has an inlet and an outlet; a first condenser configured to condense the fluid, wherein the first condenser has an inlet and an outlet; a first channel coupled between the outlet of the first evaporator and the inlet of the first condenser; a second channel coupled between the outlet of the first condenser and the inlet of the first evaporator; and a first micro-pump located in the second channel and operable to pump the fluid in the second channel from the first condenser to the first evaporator.

17 Claims, 7 Drawing Sheets

(56) References Cited

U.S. PATENT DOCUMENTS

| | | | | |
|---|---|---|---|---|
| 2013/0107455 A1* | 5/2013 | Cottet | ............... | F28D 15/0266 |
| | | | | 361/694 |
| 2014/0246176 A1* | 9/2014 | Yang | ............... | F28D 15/0266 |
| | | | | 165/104.26 |
| 2014/0321050 A1* | 10/2014 | Sato | ............... | G06F 1/20 |
| | | | | 361/679.47 |
| 2014/0331709 A1* | 11/2014 | Chiba | ............... | F28F 13/06 |
| | | | | 62/404 |
| 2016/0018139 A1* | 1/2016 | Olsson | ............... | F25B 21/02 |
| | | | | 62/3.3 |
| 2016/0085277 A1* | 3/2016 | Samadiani | ............... | G06F 1/20 |
| | | | | 361/679.53 |
| 2017/0003083 A1* | 1/2017 | Manninen | ............... | F28D 15/025 |
| 2017/0293329 A1* | 10/2017 | Chiriac | ............... | G06F 1/203 |
| 2018/0031327 A1* | 2/2018 | Chou | ............... | F28F 3/14 |
| 2018/0049346 A1* | 2/2018 | Chiriac | ............... | G06F 1/20 |

* cited by examiner

ENHANCED COOLING OF AN ELECTRONIC DEVICE USING MICROPUMPS IN THERMOSIPHONS

TECHNICAL FIELD

Certain aspects of the technology discussed below generally relate to a heat dissipating device and, more particularly, to cooling electronic components using thermosiphons having one or more micro-pumps therein.

BACKGROUND

Electronic devices include internal components that generate heat. Examples of these internal components include central processing units (CPUs), graphics processing units (GPUs), integrated circuits (ICs), and memory. The heat generated by some of these internal components can be significant. Specifically, a high performance CPU and/or GPU of an electronic device can generate significant heat, especially when performing data intensive operations (e.g., games or processing video).

To counter or dissipate the heat generated by the CPU and/or GPU, an electronic device may include heat dissipating devices, such as heat spreaders, closed-pumped liquid loops, heat pipes, and/or vapor chambers. A heat spreader generally includes a bar or plate made of a conductive material (e.g., graphite or copper) arranged to conduct heat away from a heat-generating component (e.g., a CPU or GPU) to other areas of the electronic device, possibly including a case of the device. A closed-pumped liquid loop generally includes a liquid pumped through a closed circuit to gather heat from a heat-generating component and release heat in other areas of the electronic device. Heat pipes and vapor chambers generally include a closed circuit containing a fluid. The fluid evaporates in an evaporator to gather heat, and the gaseous fluid traverses the circuit to a condenser, where the gaseous fluid condenses and releases the heat. The evaporator is generally adjacent to a heat-generating component, and the condenser is generally away from the heat-generating component in another area of the electronic device (e.g., adjacent to a case of the electronic device).

BRIEF SUMMARY

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later. After considering this discussion, and particularly after reading the section entitled "Detailed Description," one will understand how the features of this disclosure provide advantages that include increasing the heat dissipation rate of electronic components of mobile electronic devices, for example.

Certain aspects of the present disclosure generally relate to methods and apparatus for increasing the heat dissipation rate of electronic devices.

Certain aspects of the present disclosure provide a thermosiphon. The thermosiphon generally includes a fluid; a first evaporator configured to evaporate the fluid, wherein the first evaporator has an inlet and an outlet; a first condenser configured to condense the fluid, wherein the first condenser has an inlet and an outlet; a first channel coupled between the outlet of the first evaporator and the inlet of the first condenser; a second channel coupled between the outlet of the first condenser and the inlet of the first evaporator; and a first micro-pump located in the second channel and operable to pump the fluid in the second channel from the first condenser to the first evaporator.

Certain aspects of the present disclosure provide a device comprising an integrated circuit and a thermosiphon, wherein the thermosiphon generally includes a fluid; a first evaporator configured to evaporate the fluid, wherein the first evaporator has an inlet and an outlet; a first condenser configured to condense the fluid, wherein the first condenser has an inlet and an outlet; a first channel coupled between the outlet of the first evaporator and the inlet of the first condenser; a second channel coupled between the outlet of the first condenser and the inlet of the first evaporator; and a first micro-pump located in the second channel and operable to pump the fluid in the second channel from the first condenser to the first evaporator.

Certain aspects of the present disclosure provide an apparatus. The apparatus generally includes first means for evaporating a fluid, first means for condensing the fluid, first means for containing the fluid coupled between the first means for evaporating and the first means for condensing, second means for containing the fluid between the first means for condensing and the first means for evaporating; and a first means for pumping, located in the second means for containing, from the first means for condensing to the first means for evaporating.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. The appended drawings illustrate only certain typical aspects of this disclosure, however, and are therefore not to be considered limiting of its scope, for the description may admit to other equally effective aspects.

To facilitate understanding, identical reference numerals have been used, where possible, to designate identical elements that are common to the figures. Elements disclosed in one aspect may be beneficially utilized in other aspects without specific recitation.

DETAILED DESCRIPTION

Aspects of the present disclosure provide apparatuses, methods, and hardware components for cooling electronic devices using thermosiphon coolers having one or more embedded micro-pumps.

In order to achieve higher performance levels, electronic devices must dissipate increasing amounts of energy. Due to the compact size of certain electronic devices, such as mobile devices, the high energy density can lead to both hot internal components and hot external surfaces. High temperatures of internal components and/or external surfaces can lead to reliability problems and concerns regarding user comfort and safety. For example, a cell phone that is in continuous use for an extended period (e.g., when providing navigation services) can become very warm, making it unpleasant for a user to hold the phone in his hand or up to his face to make a phone call. It is therefore desirable to limit temperatures of internal components and external surfaces of electronic devices.

According to aspects of the present disclosure, an electronic component cooled by a thermosiphon, which has a reduced dependency on gravity and the orientation of the electronic device and the thermosiphon, is provided.

In aspects of the present disclosure, internal temperatures of an electronic device (or more specifically, of a component therein) are reduced, as compared to similar electronic devices (or components) using previously known cooling techniques.

According to aspects of the present disclosure, a case of an electronic device is shielded from hot internal components of the electronic device through two-phase refrigeration cooling and heat spreading via a thermosiphon with one or more embedded micro-pumps.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented, or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different electronic devices and hardware configurations, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Mobile Electronic Device

Figure 1:
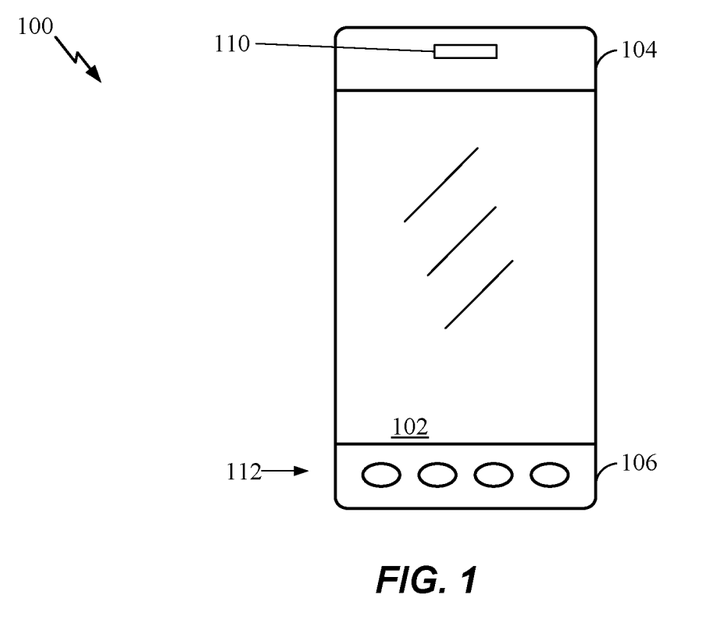
FIG. 1 illustrates a plan view an example mobile electronic device, in accordance with certain aspects of the present disclosure.

FIG. 1 illustrates an example mobile electronic device 100 in which aspects of the present disclosure may be practiced. The mobile electronic device 100 may be, for example, a cell phone or a portable electronic videogame. The mobile electronic device 100 may optionally include a display screen 102 seated in an upper faceplate 104 and a lower faceplate 106. The upper faceplate 104 may include one or more speakers, microphones, buttons, or other components 110. The lower faceplate 106 may include one or more speakers, microphones, buttons, or other components 112. Although FIG. 1 provides an example of a mobile electronic device, aspects of the present disclosure may also be implemented in other electronic devices.

Figure 2:
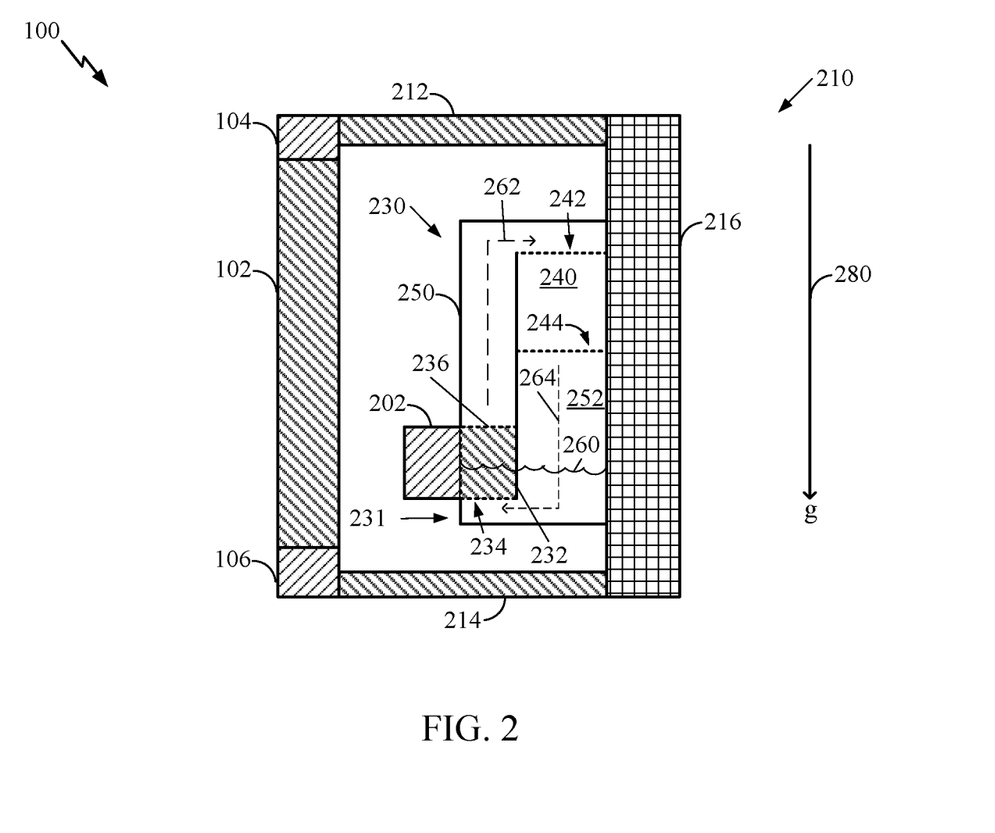
FIG. 2 illustrates a cutaway view of an example mobile electronic device, in accordance with certain aspects of the present disclosure.

FIG. 2 is a schematic view of the mobile electronic device 100 in cross-section, where the device 100 in FIG. 1 is rotated 90° to produce the view in FIG. 2. The mobile electronic device 100 includes a heat-generating component 202 (e.g., an integrated circuit (IC), such as a CPU or a GPU), an upper case piece 212, a lower case piece 214, a back 216, and a thermosiphon 230. The upper faceplate 104, lower faceplate 106, upper case piece 212, lower case piece 214, and back 216 may be collectively referred to as a case 210 of the mobile electronic device 100. In some aspects, the upper case piece 212, lower case piece 214, and back 216 may form a single unitary item.

The thermosiphon 230 includes an evaporator 232, a condenser 240, a first channel 250, a second channel 252, and a fluid 260 (e.g., water, alcohol, a refrigerant such as R-134, or various other known refrigerants). The evaporator 232 has an inlet 234 and an outlet 236, while the condenser 240 has an inlet 242 and an outlet 244. The evaporator 232 may have a number of micro-channels (not shown) that run vertically. The condenser 240 may similarly have a number of micro-channels (not shown) that run vertically. The first channel 250 is connected between the outlet 236 of the evaporator 232 and the inlet 242 of the condenser 240. The second channel 252 is connected between the outlet 244 of the condenser 240 and the inlet 234 of the evaporator 232.

According to previously known techniques, the fluid 260 may be in a liquid state at the bottom 231 of the thermosiphon 230. During operation of the mobile electronic device 100, heat is generated by the heat-generating component 202. The heat may flow (e.g., by conduction) into the evaporator 232 and be transferred into the fluid 260. Evaporation of some of the fluid 260 to form evaporated fluid causes the evaporated fluid to absorb at least some of the heat. Because the evaporated fluid is less dense than the liquid fluid, the evaporated fluid tends to rise (i.e., move in the opposite direction from the direction of gravity, symbolized by vector 280). The evaporated fluid may exit through the outlet 236 of the evaporator 232 and flow upward in the first channel 250, as symbolized by the dashed line 262. The evaporated fluid then enters the inlet 242 of the condenser 240. The evaporated fluid condenses into the liquid state in the condenser 240, releasing heat into the condenser 240. The liquid fluid tends to fall (i.e., move in the direction of gravity) due to being denser than the evaporated fluid. The liquid fluid may exit through the outlet 244 of the condenser 240 and flow downward in the second channel 252, as symbolized by the dashed line 264. The heat released in the condenser 240 may flow (e.g., by conduction) into the back 216 and/or other portions of the case 210. The heat may exit the mobile electronic device 100 from the back 216 or other portions of the case 210 via radiation, convection into the atmosphere, and/or conduction into other items contacting the mobile electronic device (e.g., a table or a user).

Figure 3:
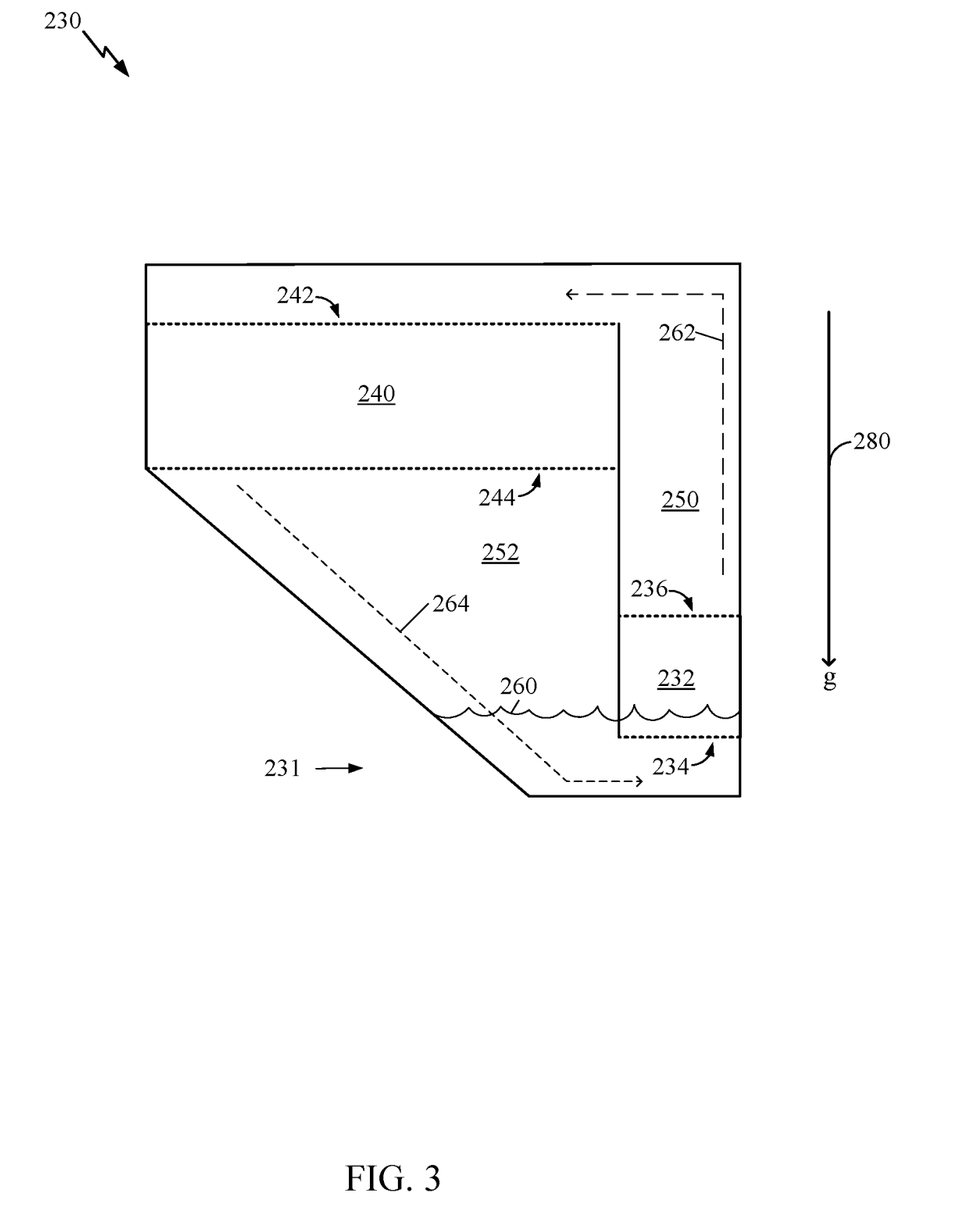
FIG. 3 illustrates an example thermosiphon, in accordance with certain aspects of the present disclosure.

FIG. 3 is a schematic plan view of the thermosiphon 230. Many of the items illustrated in FIG. 2 are illustrated in FIG. 3 with the same identifying labels, and are not further described. Because the fluid in the thermosiphon 230 transitions from a liquid state to a gaseous state and vice versa, the thermosiphon may be referred to as using two-phase cooling. The two-phase cooling provided by the thermosiphon may have higher heat transfer coefficients than cooling provided by vapor chambers and heat pipes.

Because the fluid flows in the thermosiphon 230 are driven by gravity, performance of the thermosiphon 230 may be decreased if the orientation of the mobile electronic device 100 and the thermosiphon 230 is different from the orientation indicated by the gravity vector 280. Such decreased performance may occur, for example, if the device 100 is tilted with respect to the gravity vector, or the device is rotated into a landscape orientation, rather than the portrait orientation of FIGS. 1 and 2.

According to aspects of the present disclosure, a thermosiphon with an embedded micro-pump may have improved heat transfer performance versus the previously described thermosiphon. The embedded micro-pump may improve the heat transfer performance of the thermosiphon by enhancing flow rates of the fluid in the thermosiphon.

Figure 4:
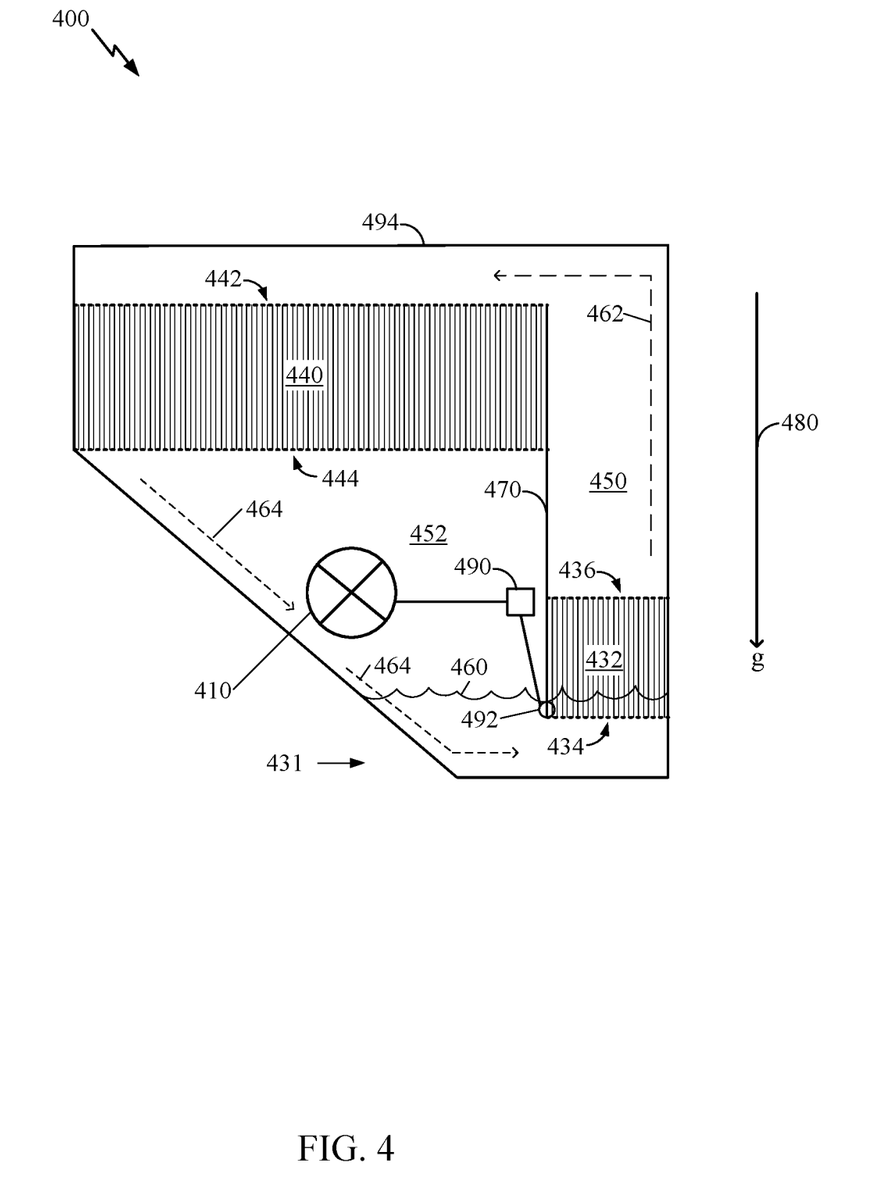
FIG. 4 illustrates an example thermosiphon having a micro-pump, in accordance with certain aspects of the present disclosure.

FIG. 4 is a schematic plan view of an example thermosiphon 400 with an embedded micro-pump 410, according to aspects of the present disclosure. The thermosiphon 400 includes an evaporator 432, a condenser 440, a first channel 450, a second channel 452, and a fluid 460 (e.g., a refrigerant). The evaporator 432 has an inlet 434 and an outlet 436, while the condenser has an inlet 442 and an outlet 444. The evaporator 432 may have a number of micro-channels that run vertically. The condenser 440 may similarly have a number of micro-channels that run vertically. The first channel 450 is connected between the outlet 436 of the evaporator 432 and the inlet 442 of the condenser 440. The second channel 452 is connected between the outlet 444 of the condenser 440 and the inlet 434 of the evaporator 432. The micro-pump 410 is located in the second channel 452 and is operable to pump the fluid 464 in the second channel 452 from the condenser 440 to the evaporator 432.

According to aspects of the present disclosure, the fluid 460 may be in a liquid state at the bottom 431 of the thermosiphon 400. During operation of a mobile electronic device (e.g., the mobile electronic device 100, shown in FIG. 1) containing the thermosiphon 400, heat generated by a heat-generating component may flow (e.g., by conduction) into the evaporator 432 and be transferred into the fluid 460. Some of the fluid 460 may absorb some of the heat and evaporate, forming an evaporated fluid. Because the evaporated fluid is less dense than the liquid fluid, the evaporated fluid tends to rise (i.e., move in the opposite direction from the direction of gravity, symbolized by vector 480). The evaporated fluid may exit the evaporator 432 through the outlet 436 and flow upward in the first channel 450, as symbolized by the dashed line 462. The evaporated fluid then enters the inlet 442 of the condenser 440. The evaporated fluid condenses into the liquid state in the condenser 440, releasing heat into the condenser 440. The liquid fluid tends to fall (i.e., move in the direction of gravity) due to being denser than the evaporated fluid. The liquid fluid may exit the condenser 440 through the outlet 444 and flow downward in the second channel 452, as symbolized by the dashed line 464. The heat released in the condenser 440 may flow (e.g., by conduction) into a case of the mobile electronic device. The heat may exit the mobile electronic device 100 from the case via radiation, convection into the atmosphere, and/or conduction into other items contacting the mobile electronic device (e.g., a table or a user).

The embedded micro-pump 410 may pump the fluid 460 in the second channel 452 toward the evaporator 432, thus increasing a flow rate of the fluid 460 throughout the thermosiphon. The increased flow rate of the fluid 460 may result in an increased cooling capacity of the thermosiphon 400 when compared with a thermosiphon without an embedded micro-pump.

In aspects of the present disclosure, the embedded micro-pump (e.g., micro-pumps 410, 710, and 711 shown in FIGS. 4 and 7) of a thermosiphon may be driven with electricity supplied by a battery or other source within a mobile electronic device containing the thermosiphon.

According to aspects of the present disclosure, the thermosiphon may include a wall 470 separating the first channel 450 from the second channel 452.

In aspects of the present disclosure, the thermosiphon 400 may include a housing 494, with each of the evaporator 432, the condenser 440, the first channel 450, and the second channel 452 disposed in the housing.

According to aspects of the present disclosure, the thermosiphon 400 may include a sensor 492 configured to sense at least one operating parameter (e.g., a temperature, a pressure, or a flow-rate) of the thermosiphon and a control device 490 (e.g., a microcontroller or a switch) configured to control the operation of the micro-pump 410. The control device 490 may be located internal or external to the housing of the thermosiphon. The sensor 492 may provide an indication of the at least one operating parameter to the control device 490, which may control the operation of the micro-pump 410 in response to the indication. For example, the sensor 492 may detect a temperature of the evaporator 432 and provide an indication of the temperature to the control device 490. In the example, the control device 490 may be a microcontroller that is configured to command the micro-pump 410 to begin pumping and/or speed up pumping when the indication is that the temperature of the evaporator 432 is high. In a second example, the sensor may detect a temperature of the fluid 460 within the evaporator 432. In the second example, the control device 490 may be a microcontroller configured to command the micro-pump 410 to begin pumping and/or speed up pumping when the indication is that the temperature of the fluid within the evaporator 432 is high.

In aspects of the present disclosure, the control device 490 may be a switch configured to turn on the micro-pump 410 when the indication from the sensor 492 is that a temperature of the evaporator 432 or fluid 460 within the evaporator is high (e.g., higher than a threshold temperature).

According to aspects of the present disclosure, the sensor 492 and control device 490 may be implemented as a single thermostat or heat-sensitive switch.

Figure 5:
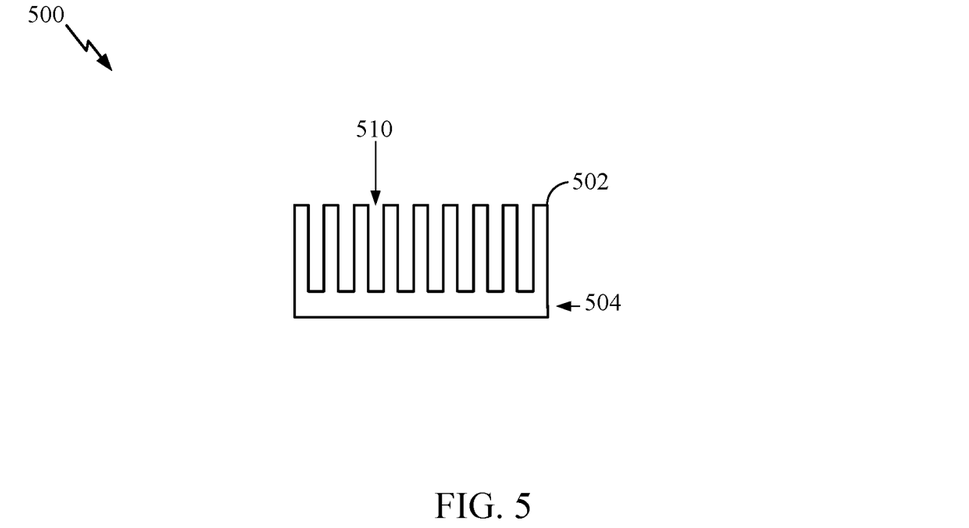
FIG. 5 illustrates an example evaporator, in accordance with certain aspects of the present disclosure.

FIG. 5 is a profile view of an exemplary evaporator 500, according to aspects of the present disclosure. The evaporator 500 may be an example of or similar to the evaporators 232, 432, 732, and 733 described herein with reference to FIGS. 2, 4, and 7. The evaporator 500 includes a plurality of fins 502 extending from a back 504. The fins 502 may be arranged such that micro-channels 510 are between the fins 502. The evaporator 500 may be formed from aluminum nitride, copper, ceramics, or various materials by processes including cutting, bending, molding, bonding, and other techniques known in the art.

Figure 6:
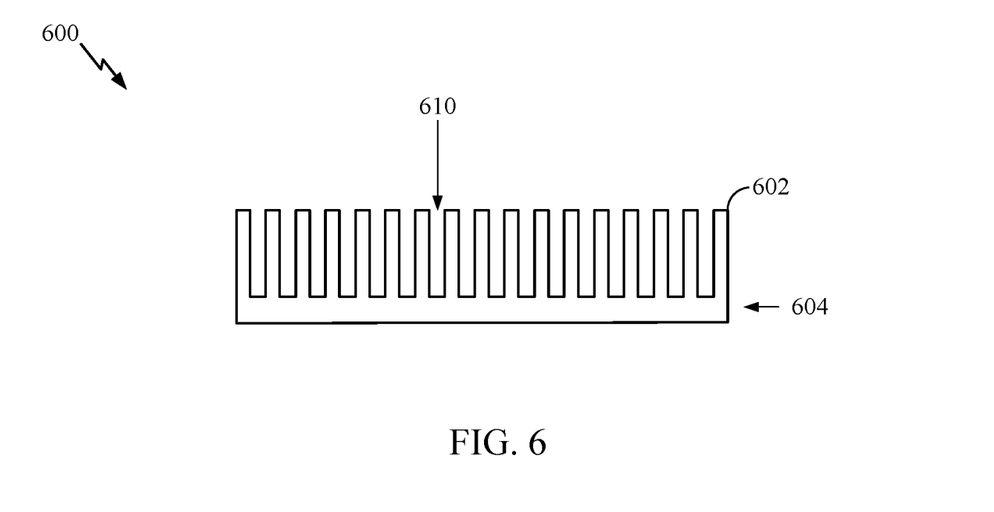
FIG. 6 illustrates an example condenser, in accordance with certain aspects of the present disclosure.

FIG. 6 is a profile view of an exemplary condenser 600, according to aspects of the present disclosure. The condenser 600 may be an example of or similar to the condensers 240, 440, 740, and 741 described herein with reference to FIGS. 2, 4, and 7. The condenser 600 includes a plurality of fins 602 extending from a back 604. The fins 602 may be arranged such that micro-channels 610 are between the fins 602. The condenser 600 may be formed from aluminum nitride, copper, ceramics, or various materials by processes including cutting, bending, molding, bonding, and other techniques known in the art.

In aspects of the present disclosure, a thermosiphon with two evaporators, two condensers, and two micro-pumps may provide enhanced cooling performance.

Figure 7:
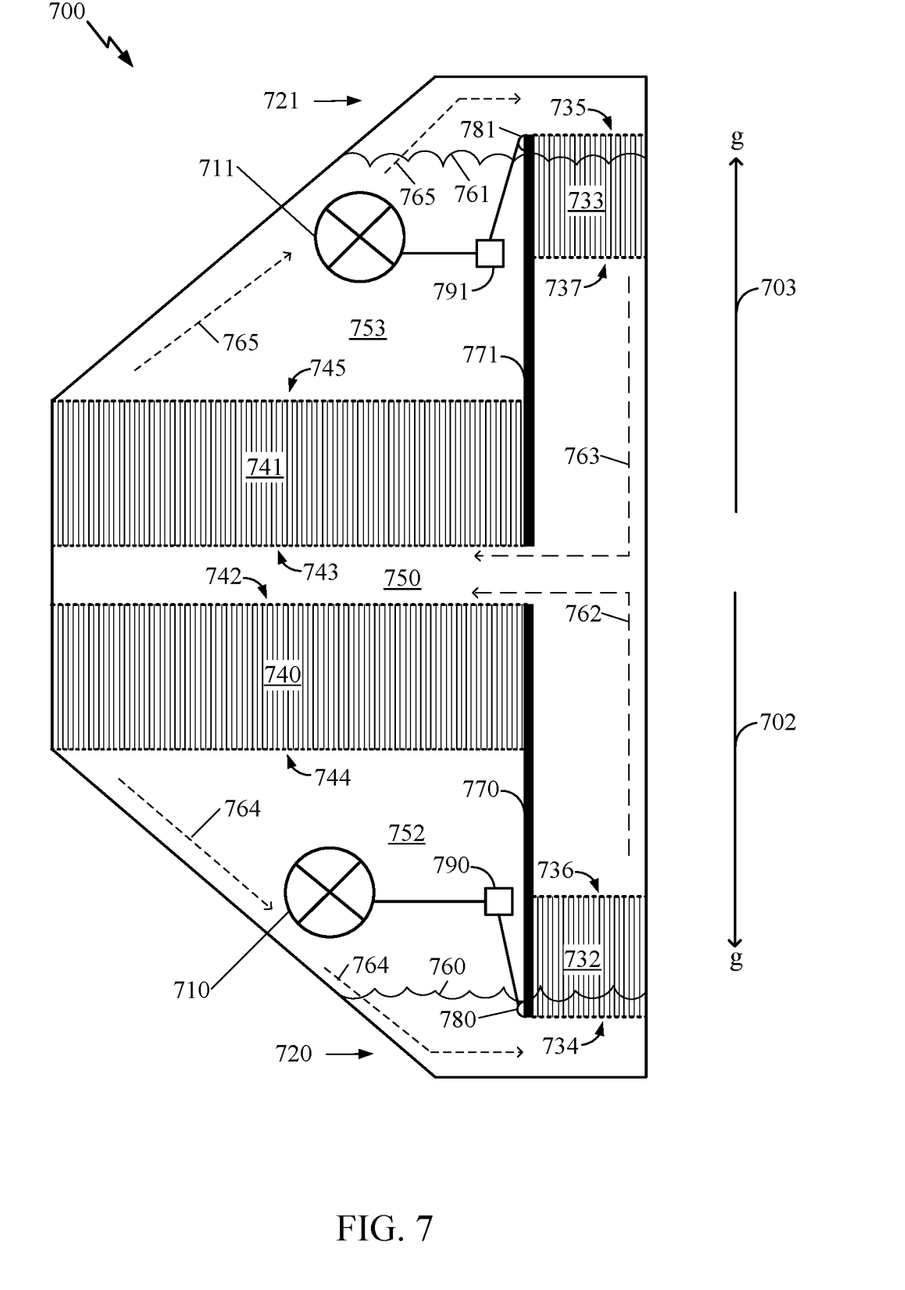
FIG. 7 illustrates an example thermosiphon having two condensers, in accordance with certain aspects of the present disclosure.

FIG. 7 is a schematic plan view of a thermosiphon 700 with two evaporators 732 and 733, two condensers 740 and 741, and two micro-pumps 710 and 711, according to aspects of the present disclosure. The thermosiphon 700 also includes a first channel 750, a second channel 752, a third channel 753, and a fluid 760 and 761 (e.g., a refrigerant). The first evaporator 732 has an inlet 734 and an outlet 736, while the second evaporator 733 has an inlet 735 and an outlet 737. The first condenser 740 has an inlet 742 and an outlet 744, while the second condenser 741 has an inlet 743 and an outlet 745. The first evaporator 732, second evaporator 733, first condenser 740, and second condenser 741 may have a number of micro-channels that run vertically. The first channel 750 connects the outlet 736 of the first evaporator 732 and the outlet 737 of the second evaporator 733 with the inlet 742 of the first condenser 740 and the inlet 743 of the second condenser 741. The second channel 752 is connected between the outlet 744 of the first condenser 740 and the inlet 734 of the first evaporator 732. The third channel 753 is connected between the outlet 745 of the second condenser 741 and the inlet 735 of the second evaporator 733. The first micro-pump 710 is located in the second channel 752 and is operable to pump the fluid 764 in the second channel 752 from the first condenser 740 to the first evaporator 732. Similarly, the second micro-pump 711 is located in the third channel 753 and is operable to pump the fluid 765 in the third channel 753 from the second condenser 741 to the second evaporator 733.

According to aspects of the present disclosure, the fluid 760 may be in a liquid state at the bottom 720 and/or the top 721 of the thermosiphon 700, depending on the orientation of the thermosiphon 700 with respect to gravity. During operation of a mobile electronic device (e.g., the mobile electronic device 100, shown in FIG. 1) containing the thermosiphon 700, heat generated by a heat-generating component may flow (e.g., by conduction) into the first evaporator 732 and/or the second evaporator 733. The orientation of the thermosiphon 700 (and, hence the mobile electronic device including the thermosiphon 700) with respect to gravity may impact operation of the thermosiphon 700.

For example, if the orientation of the thermosiphon 700 is such that gravity is as shown by vector 702, then the fluid at the bottom 720 may be in a liquid state, while the fluid at the top 721 may be in a gaseous state. Heat flowing into the first evaporator 732 may be transferred into the fluid 760, and heat flowing into the second evaporator 733 may be transferred into the fluid 761. Some of the fluid 760 may absorb some of the heat from the first evaporator 732 and evaporate, forming an evaporated fluid. Some of the fluid 761 may absorb some of the heat from the second evaporator 733. Because the evaporated fluid is less dense than the liquid fluid, the evaporated fluid tends to rise (i.e., move in the opposite direction from the direction of gravity, symbolized by vector 702). The evaporated fluid may exit the first evaporator 732 through the outlet 736 and flow upward in the first channel 750, as symbolized by the dashed line 762. The evaporated fluid then enters the inlet 742 of the condenser 740 and/or the inlet 743 of the condenser 741. The evaporated fluid condenses into the liquid state in the condenser 740 and/or in the condenser 741, releasing heat into the respective condensers 740 and 741. The liquid fluid tends to fall (i.e., move in the direction of gravity) due to being denser than the evaporated fluid. The liquid fluid may exit the condenser 740 through the outlet 744 and flow downward in the second channel 752, as symbolized by the dashed line 764. The heat released in the condenser 740 and the second condenser 741 may flow (e.g., by conduction) into a case of the mobile electronic device. If micro-pump 711 is pumping, then some fluid may be pumped from the second condenser 741 to the second evaporator 733, as symbolized by the dashed line 765. The fluid pumped from the second condenser 741 to the second evaporator 733 may include small droplets in liquid form entrained in fluid in a gaseous state. Additionally or alternatively, some liquid fluid may exit the condenser 741 via the inlet 743 and then enter the first condenser 740.

In another example, if the orientation of the thermosiphon 700 is such that gravity is as shown by vector 703, then the fluid at the bottom 720 may be in a gaseous state, while the fluid at the top 721 may be in a liquid state. Heat flowing into the first evaporator 732 may be transferred into the fluid 760, and heat flowing into the second evaporator 733 may be transferred into the fluid 761. Some of the fluid 761 may absorb some of the heat from the second evaporator 733 and evaporate, forming an evaporated fluid. Some of the fluid 760 may absorb some of the heat from the first evaporator 732. Because the evaporated fluid is less dense than the liquid fluid, the evaporated fluid tends to rise (i.e., move in the opposite direction from the direction of gravity, symbolized by vector 703). The evaporated fluid may exit the second evaporator 733 through the outlet 737 and flow upward (i.e., opposite the direction of gravity shown at 703) in the first channel 750, as symbolized by the dashed line 763. The evaporated fluid then enters the inlet 742 of the condenser 740 and/or the inlet 743 of the condenser 741. The evaporated fluid condenses into the liquid state in the condenser 740 and/or in the condenser 741, releasing heat into the respective condensers 740 and 741. The liquid fluid tends to fall (i.e., move in the direction of gravity) due to being denser than the evaporated fluid. The liquid fluid may exit the condenser 741 through the outlet 745 and flow downward in the third channel 753, as symbolized by the dashed line 765. The heat released in the first condenser 740 and the second condenser 741 may flow (e.g., by conduction) into a case of the mobile electronic device. If micro-pump 710 is pumping, then some fluid may be pumped from the first condenser 740 to the first evaporator 732, as symbolized by the dashed line 764. The fluid pumped from the first condenser 740 to the first evaporator 732 may include small droplets in liquid form entrained in fluid in a gaseous state. Additionally or alternatively, some liquid fluid may exit the condenser 740 via the inlet 742 and then enter the second condenser 741.

If the orientation of the thermosiphon is such that gravity is not in either of the directions shown at 702 and 703 (e.g., the mobile electronic device is tilted or lying flat), then the fluid may exist in the liquid state at both the bottom 720 and the top 721, and the fluid may exit each of the first condenser 740 and the second condenser 741 in a liquid state.

According to aspects of the present disclosure, the thermosiphon 700 may include a first wall 770 that separates the first channel 750 from the second channel 752 and a second wall 771 that separates the first channel 750 from the third channel 753.

In aspects of the present disclosure, the thermosiphon 700 may include a housing, with each of the first evaporator 732, the second evaporator 733, the first condenser 740, the second condenser 741, the first channel 750, the second channel 752, and the third channel 753 disposed in the housing.

According to aspects of the present disclosure, the thermosiphon 700 may include one or more sensors 780 and 781 configured to sense at least one operating parameter (e.g., a temperature, a pressure, or a flow-rate) of the thermosiphon 700 and one or more control devices 790 and 791 (e.g., a microcontroller or a switch) configured to control the operation of the micro-pumps 710 and 711. The sensors 780 and 781 may provide one or more indications of the at least one operating parameter to the control devices 790 and/or 791, which may control the operation of the micro-pumps 710 and 711 in response to the indication. The micro-pumps 710 and 711 may operate independently, based on independent control signals from the control devices 790 and 791. Additionally or alternatively, the micro-pumps 710 and 711 may operate synchronously, based on a control signal, generated by the control devices 790 and 791, based on a combination (e.g., an average or maximum) of the indications of the operating parameter obtained from the sensors 780 and 781. For example, the sensor 781 may detect a temperature of the evaporator 733 and provide an indication of the temperature to the control device 791. In the example, the control device 791 may be a microcontroller that is configured to command the second micro-pump 711 to begin pumping and/or speed up pumping when the indication is that the temperature of the second evaporator 733 is high. In the example, the microcontroller may also be configured to command the second micro-pump 711 to stop pumping and/or slow down pumping when the indication is that the temperature of the second evaporator 733 is low. In a second example, the sensor may detect a temperature of the fluid 761 within the second evaporator 733. In the second example, the control device 791 may be a microcontroller configured to command the second micro-pump 711 to begin pumping and/or speed up pumping when the indication is that the temperature of the fluid within the second evaporator 733 is high. In the second example, the microcontroller may also be configured to command the second micro-pump 711 to stop pumping and/or slow down pumping when the indication is that the temperature of the fluid within the second evaporator 733 is low.

Figure 8:
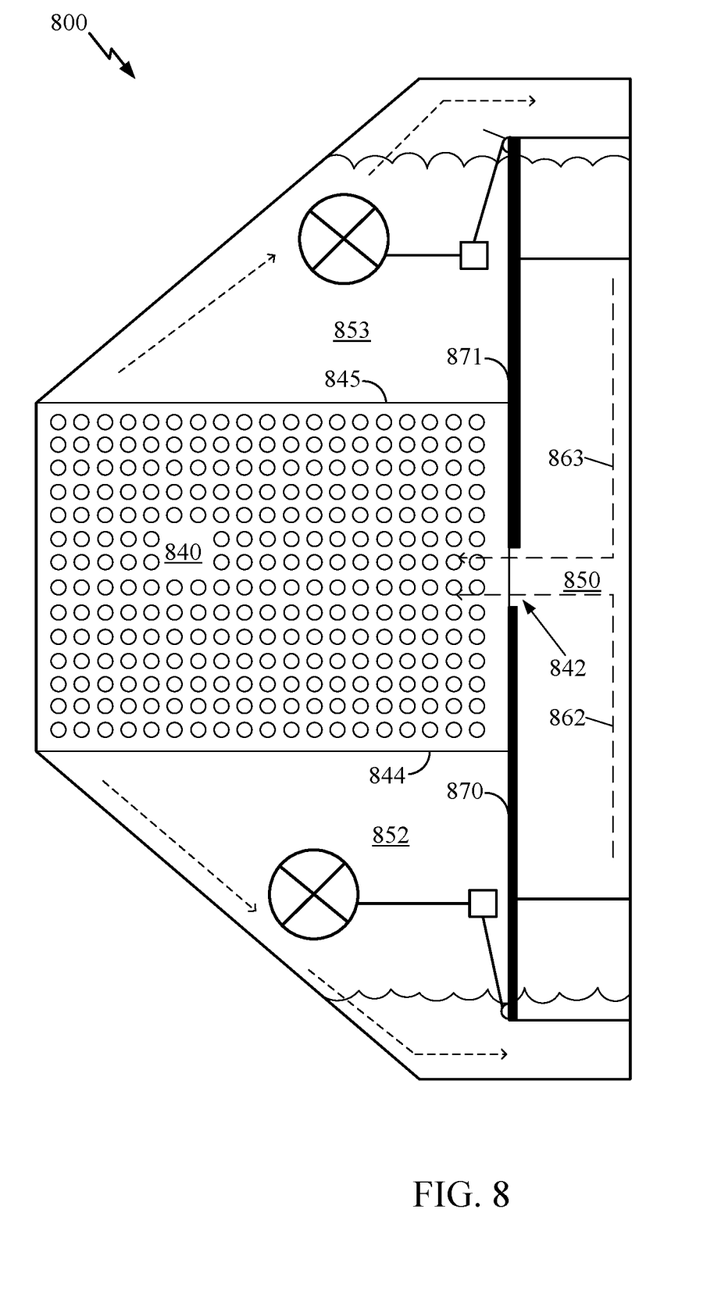
FIG. 8 illustrates an example thermosiphon having a pin fin condenser, in accordance with certain aspects of the present disclosure.

FIG. 8 is a schematic plan view of a thermosiphon 800, according to aspects of the present disclosure. In the thermosiphon 800, many components are similar to the components described with reference to FIG. 7, and will not be further described. The thermosiphon 800 includes a pin fin condenser 840, instead of the two condensers having microchannels of the thermosiphon 700. In the thermosiphon 800, the fluid 862 and 863 may leave the first channel 850 and enter the condenser 840 via an inlet 842. The inlet 842 may be formed by leaving a space between an end of a first wall 870 and an end of a second wall 871. The first wall may separate the first channel 850 from a second channel 852. Similarly, the second wall may separate the first channel 850 from the third channel 853. The fluid may condense within the pin fin condenser 840. The fluid may exit the pin fin condenser 840 through the outlet 844 and/or the outlet 845. The pin fin condenser 840 may be formed from aluminum nitride, copper, ceramics, or various materials by processes including cutting, bending, molding, bonding, and other techniques known in the art.

Figure 9:
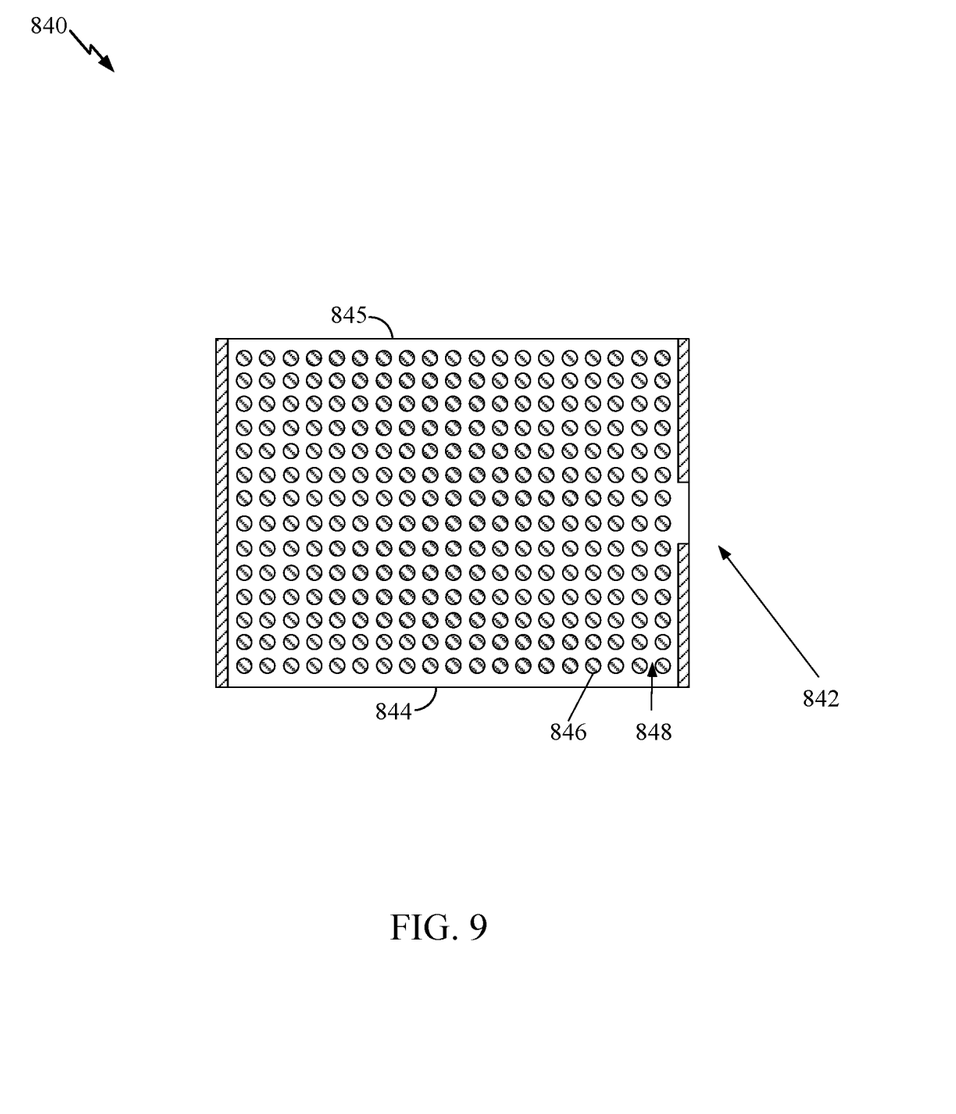
FIG. 9 illustrates an example pin fin condenser, in accordance with certain aspects of the present disclosure.

FIG. 9 is a cutaway view 900 of the pin fin condenser 840 of FIG. 8. The pin fin condenser 840 includes a plurality of pins 846, with spaces 848 between the pins 846 forming a plurality of flow paths connecting the inlet 842 with the outlets 844 and 845. Fluid in the thermosiphon 800 may enter the pin fin condenser 840 through the inlet 842. The fluid may condense on and transfer heat to the pins 846. The fluid may then exit the pin fin condenser 840 via the outlet 844 and/or the outlet 845. As with the condensers 440, 740, and 741 shown in FIGS. 4 and 7, the heat released in the pin fin condenser 840 may flow (e.g., by conduction) into a case of the mobile electronic device.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

One or more of the components and/or features illustrated in FIGS. 1-9 may be rearranged and/or combined into a single component or feature or embodied in several components or functions. Additional elements, components, and/or features may also be added without departing from the disclosure.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A thermosiphon comprising:
a fluid;
a first evaporator configured to evaporate the fluid, wherein the first evaporator has an inlet and an outlet;
a first condenser configured to condense the fluid, wherein the first condenser comprises a pin fin condenser and has an inlet and an outlet and wherein the pin fin condenser comprises a plurality of pins arranged such that a plurality of flow paths exist between pins of the plurality of pins, the plurality of flow paths connecting the inlet to the outlet of the first condenser;
a first channel coupled between the outlet of the first evaporator and the inlet of the first condenser;
a second channel coupled between the outlet of the first condenser and the inlet of the first evaporator;

a first micro-pump located in the second channel and operable to pump the fluid in the second channel from the first condenser to the first evaporator;

a second evaporator having an inlet and an outlet;

a third channel coupled between another outlet of the first condenser and the inlet of the second evaporator;

a first wall configured to separate the first channel from the second channel; and a second wall configured to separate the first channel from the third channel, wherein a space between the first and second walls forms the inlet of the first condenser.

2. The thermosiphon of claim 1, further comprising a wall configured to separate the first channel from the second channel.

3. The thermosiphon of claim 1, further comprising:
a housing, wherein the first evaporator, the first condenser, the first channel, and the second channel are disposed in the housing.

4. The thermosiphon of claim 1, further comprising:
a sensor configured to sense at least one operating parameter of the thermosiphon; and
a controller configured to control operation of the first micro-pump, wherein:
 the sensor is configured to provide an indication of the at least one operating parameter to the controller, and
 the controller is configured to control the operation of the first micro-pump based on the indication.

5. The thermosiphon of claim 4, wherein the at least one operating parameter comprises a temperature of the first evaporator.

6. The thermosiphon of claim 4, wherein the at least one operating parameter comprises a temperature of the fluid within the first evaporator.

7. The thermosiphon of claim 1, further comprising:
a switch configured to control operation of the first micro-pump, wherein the switch is responsive to a temperature.

8. The thermosiphon of claim 7, wherein the temperature is a temperature of the first evaporator.

9. The thermosiphon of claim 7, wherein the temperature is a temperature of the fluid within the first evaporator.

10. The thermosiphon of claim 1, further comprising:
a second evaporator configured to evaporate the fluid, wherein the second evaporator has an inlet and an outlet;
a second condenser configured to condense the fluid, wherein the second condenser has an inlet and an outlet and wherein the first channel is further coupled between the outlet of the second evaporator and the inlet of the second condenser;
a third channel coupled between the outlet of the second condenser and the inlet of the second evaporator; and
a second micro-pump located in the third channel and operable to pump the fluid in the third channel from the second condenser to the second evaporator.

11. The thermosiphon of claim 10, further comprising:
a first wall configured to separate the first channel from the second channel; and
a second wall configured to separate the first channel from the third channel.

12. The thermosiphon of claim 1, further comprising:
a second micro-pump located in the third channel and operable to pump the fluid in the third channel from the first condenser to the second evaporator.

13. A device comprising an integrated circuit and the thermosiphon of claim 1, wherein the thermosiphon is disposed adjacent to the integrated circuit and is configured to remove heat from the integrated circuit.

14. A thermosiphon comprising:
a fluid;
a first evaporator configured to evaporate the fluid, wherein the first evaporator has an inlet and an outlet;
a first condenser configured to condense the fluid, wherein the first condenser has an inlet and an outlet;
a first channel coupled between the outlet of the first evaporator and the inlet of the first condenser;
a second channel coupled between the outlet of the first condenser and the inlet of the first evaporator;
a first micro-pump located in the second channel and operable to pump the fluid in the second channel from the first condenser to the first evaporator;
a second evaporator having an inlet and an outlet;
a third channel coupled between another outlet of the first condenser and the inlet of the second evaporator;
a second micro-pump located in the third channel and operable to pump the fluid in the third channel from the first condenser to the second evaporator;
a first wall configured to separate the first channel from the second channel; and
a second wall configured to separate the first channel from the third channel, wherein a space between the first and second walls forms the inlet of the first condenser.

15. The thermosiphon of claim 1, wherein the pins of the pin fin condenser are arranged in a grid.

16. The thermosiphon of claim 10, wherein:
the first micro-pump is oriented to pump the fluid in the second channel in a first direction when the thermosiphon is in a first orientation; and
the second micro-pump is oriented to pump the fluid in the third channel in a second direction different from the first direction when the thermosiphon is in a second orientation different from the first orientation.

17. A thermosiphon comprising:
a fluid;
a first evaporator configured to evaporate the fluid, wherein the first evaporator has an inlet and an outlet;
a first condenser configured to condense the fluid, wherein the first condenser comprises a pin fin condenser and has an inlet and an outlet;
a first channel coupled between the outlet of the first evaporator and the inlet of the first condenser;
a second channel coupled between the outlet of the first condenser and the inlet of the first evaporator;
a first micro-pump located in the second channel and operable to pump the fluid in the second channel from the first condenser to the first evaporator, wherein the first micro-pump is arranged to pump the fluid in the second channel in a first direction when the thermosiphon is in a first orientation;
a second evaporator configured to evaporate the fluid, wherein the second evaporator has an inlet and an outlet;
a second condenser configured to condense the fluid, wherein the second condenser has an inlet and an outlet and wherein the first channel is further coupled between the outlet of the second evaporator and the inlet of the second condenser;
a third channel coupled between the outlet of the second condenser and the inlet of the second evaporator; and
a second micro-pump located in the third channel and operable to pump the fluid in the third channel from the second condenser to the second evaporator, wherein the second micro-pump is positioned to pump the fluid in the third channel in a second direction different from the first direction when the thermosiphon is in a second orientation different from the first orientation.

\* \* \* \* \*